(12) United States Patent
Chen et al.

(10) Patent No.: US 11,900,860 B2
(45) Date of Patent: Feb. 13, 2024

(54) DISPLAY PANEL, DISPLAY APPARATUS, AND DISPLAY PANEL MANUFACTURING METHOD

(71) Applicant: BOE TECHNOLOGY GROUP CO., LTD., Beijing (CN)

(72) Inventors: Yipeng Chen, Beijing (CN); Ling Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 50 days.

(21) Appl. No.: 17/328,035

(22) Filed: May 24, 2021

(65) Prior Publication Data

US 2021/0375195 A1     Dec. 2, 2021

(30) Foreign Application Priority Data

May 27, 2020  (CN) .......................... 202010463627.6

(51) Int. Cl.
*G09G 3/32* (2016.01)
*H01L 27/12* (2006.01)
*G09G 3/20* (2006.01)
*G09F 9/33* (2006.01)

(52) U.S. Cl.
CPC ............. *G09G 3/32* (2013.01); *H01L 27/124* (2013.01); *G09F 9/33* (2013.01); *G09G 3/20* (2013.01); *G09G 2300/0426* (2013.01); *G09G 2330/06* (2013.01)

(58) Field of Classification Search
CPC .......... G09G 3/20; G09G 3/32; G09G 3/3208; G09G 2330/06; G09G 2300/04; G09G 2300/0426; H01L 27/124; H01L 27/1259; H01L 27/3272; H01L 27/3276; H01L 27/3288; G09F 9/33

USPC ........................................................... 345/76
See application file for complete search history.

(56) References Cited

U.S. PATENT DOCUMENTS

2020/0350394 A1* 11/2020 Lou ..................... H01L 27/3288
2021/0191552 A1*  6/2021 Bok ..................... G06F 3/0443
2022/0238071 A1*  7/2022 Chen .................... G09G 3/3233

FOREIGN PATENT DOCUMENTS

CN          208861990 U      5/2019

OTHER PUBLICATIONS

Office Action dated Jul. 27, 2022, in corresponding Chinese patent Application No. 202010463627.6, 13 pages.

* cited by examiner

*Primary Examiner* — Jason M Mandeville
(74) *Attorney, Agent, or Firm* — XSENSUS LLP

(57) ABSTRACT

The present application discloses a display panel, a display apparatus, and a display panel manufacturing method. The display panel includes a main display region and a sub display region, where the sub display region is fully-surrounded or half-surrounded by the main display region, the sub display region includes a substrate, a first insulating layer, a first metal layer, a second insulating layer, a second metal layer, a dielectric layer, a third metal layer, and a flat layer stacked successively. A signal line of the first metal layer is used to transmit a scan signal of the main display region, and a signal line of the third metal layer is used to transmit a display data signal of the sub display region; the second metal layer is used as an isolation layer for isolating signal interference between the first metal layer and the second metal layer.

15 Claims, 5 Drawing Sheets

DISPLAY PANEL, DISPLAY APPARATUS, AND DISPLAY PANEL MANUFACTURING METHOD

CROSS-REFERENCE TO RELATED APPLICATION

This application claims the benefit of and priority to Chinese Patent Application No. 202010463627.6, filed on May 27, 2020, the contents of which being incorporated by reference in their entirety herein.

TECHNICAL FIELD

The present disclosure generally relates to the field of display technology and, in particular, to a display panel, a display apparatus, and a display panel manufacturing method.

BACKGROUND

With the rapid development of electronic devices, consumers have higher and higher requirements for screen ratio, and full screen display of electronic devices has received more and more attention.

Existing electronic devices, such as mobile phones, tablets, etc., need to integrate a camera, a handset, and an infrared induction element or the like. The above elements are set by slotting or opening on the display screen in the related art, but no pixel unit for display is set in the slots and opening regions.

Alternatively, a manner of a main screen and a sub screen is used. The photosensitive element and the pixel for display are set in the sub screen. Although the full screen is implemented, signal interference between the main screen and the sub screen causes degradation of display quality of the main screen.

SUMMARY

In view of the above-described defects or insufficiencies in the related art, it is desirable to provide a display panel, a display apparatus, and a display panel manufacturing method for reducing interference between the main screen and the sub screen.

In the first aspect, there is provided a display panel, including a main display region and a sub display region, wherein the sub display region is fully-surrounded or half-surrounded by the main display region, the sub display region includes a substrate, a first insulating layer, a first metal layer, a second insulating layer, a second metal layer, a dielectric layer, a third metal layer and a flat layer stacked successively, wherein a signal line of the first metal layer is used to transmit a scan signal of the main display region, and a signal line of the third metal layer is used to transmit a display data signal of the sub display region;

the second metal layer is used as an isolation layer, for isolating signal interference between the first metal layer and the second metal layer.

In some embodiments, an orthographic projection of the second metal layer on the substrate at least covers an orthographic projection of the third metal layer on the substrate.

In some embodiments, the second metal layer is a surface-shaped film and connected to a power source signal of the display panel.

In some embodiments, a pixel unit of the sub display region includes a first sub-pixel, and the first sub-pixel is a light-transmitting sub-pixel that is able to transmit external light.

In some embodiments, the pixel unit of the sub display region further includes a second sub-pixel, a third sub-pixel and a fourth sub-pixel, each of which is provided with an electroluminescent device respectively, and the electroluminescent device is disposed in a functional layer on the flat layer;

a pixel unit of the main display region includes a first sub-pixel, a second sub-pixel, and a third sub-pixel, each of which is provided with an electroluminescent device respectively, and the electroluminescent device of the first sub-pixel includes a first light-emitting region and a second light emitting region that are symmetrical.

In some embodiments, the light-transmitting sub-pixel includes an opening region, the opening region penetrates the substrate, the first insulating layer, the first metal layer, the second insulating layer, the second metal layer, the dielectric layer, the third metal layer, the flat layer and the functional layer, and the opening region is provided with a light-transmitting material.

In some embodiments, the main display region includes a substrate, a first insulating layer, a first gate electrode, a second insulating layer, a second gate electrode, a dielectric layer, a source-drain layer, and a flat layer stacked successively, wherein the first gate electrode and the first metal layer are disposed in an identical layer;

the second gate electrode and the second metal layer are disposed in an identical layer;

the source-drain layer and the third metal layer are disposed in an identical layer.

In the second aspect, there is provided a display apparatus, including any of the display panels described above, a side of the sub display region deviated from the first metal layer is provided with a photosensitive element, which senses external light through a light-transmitting sub-pixel of the sub display region.

In the third aspect, there is provided a method of manufacturing a display panel, wherein the display panel includes a main display region and a sub display region, and the manufacturing method includes:

forming a substrate and a first insulating layer successively;

forming patterns of a first gate electrode of a main display region and a first metal layer of a sub display region respectively;

forming a second insulating layer;

forming patterns of a second gate electrode of the main display region and a second metal layer of the sub display region respectively;

forming a dielectric layer;

forming patterns of a source-drain layer of the main display region and a third metal layer of the sub display region respectively; and forming a flat layer.

According to the technical solution provided by embodiments of the present application, a second metal layer is provided between the first metal layer and the third metal layer of a sub display region of the display panel including a main display region and the sub display region, to prevent signal interference between the first metal layer and the third metal layer. The first metal layer is used to transmit a scan signal of the main display region, and the third metal layer is used to transmit a display data signal of the sub display screen.

BRIEF DESCRIPTION OF THE DRAWINGS

Other features, objects, and advantages of the present application will become more apparent from the detailed description of the non-limiting embodiments with reference to the following drawings.

DETAILED DESCRIPTION

Figure 1:
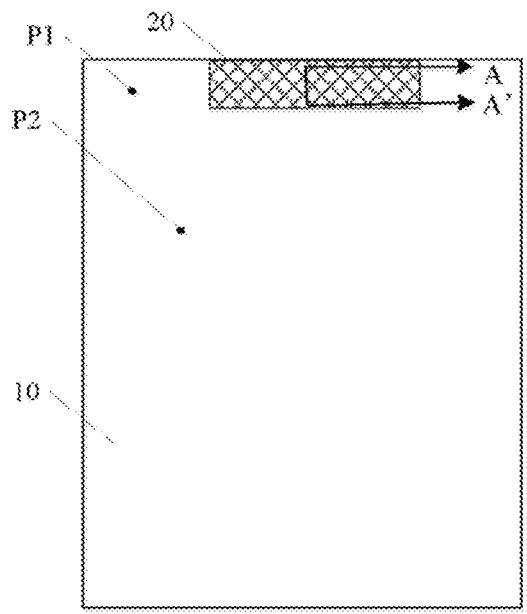
FIG. 1 shows an exemplary structural block diagram of a display panel.

The detailed description will be further described below with reference to the accompanying drawings and embodiments. It will be appreciated that the specific embodiments described herein are only used to explain the relevant disclosure, and is not to limit the disclosure. It will also be also to be noted that only the portions associated with the disclosure are shown in the drawings, for convenience.

Unless otherwise defined, technical terms or scientific terms used in this disclosure are usual meanings understood by those who have general skills in the art of the present disclosure. The terms "first", "second", and similar words used in this disclosure do not represent any order, quantity, or importance, but only used to distinguish different components. Similar words, such as "include" or "includes", mean that the elements or objects appearing before the word contain elements or objects that appear after the word or the equivalents, without excluding other elements or objects. Similar words such as "connect" or "couple" are not limited to physical or mechanical connections, but may include electrical connections, whether direct or indirect. "On", "under", "left", "right", etc. are only used to indicate the relative positional relationship. The relative positional relationship may change accordingly when the absolute position of the described object is changed.

It should be noted that embodiments in the present application and features in the embodiments may be combined with each other when there is no conflict. The present application will be described in detail below with reference to the accompanying drawings and in combination with the embodiments.

Figure 2:
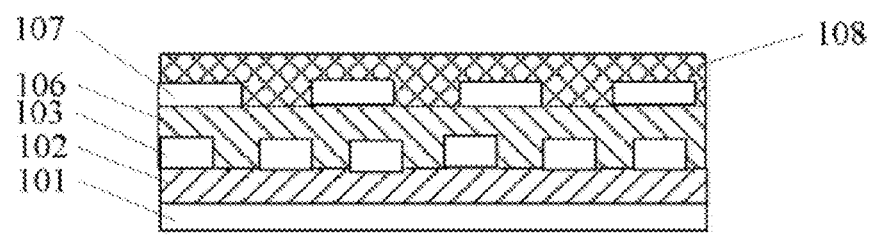
FIG. 2 shows a cross-sectional view along the A-A' line of FIG. 1.

Please refer to FIG. 1 and FIG. 2, FIG. 1 shows an exemplary structural block diagram of a display panel, and FIG. 2 shows a cross-sectional view along the A-A' line of FIG. 1. As shown in FIG. 1, the display panel includes a main display region 10 and a sub display region 20. The main display region is a normal display region. The sub display region is a region that can photograph and display, for example, a region under which cameras and sensors or the like are disposed. The sub display region 20 is surrounded by the main display region 10. In the present application, "surround" includes "fully-surround" or "half-surround", where "fully-surround" means that the sub display region is located in the middle of the main display region, for example, and "half-surround" means that the sub display region is located at an edge of the main display region, for example. As shown in FIG. 2, the display panel includes a substrate 101, a first insulating layer 102, a first metal layer 103, a dielectric layer 106, and a third metal layer 107 stacked successively. A signal line of the first metal layer 103 is used to transmit a scan signal of the main display region, and a signal line of the third metal layer 107 is used to transmit a display data signal of the sub display region.

It can be seen that, in order to drive pixel units of the main display region at two sides of the sub display region, the scan signal line of the first metal layer provides a scan signal to the main display region at two sides through the sub display region. At this time, the display data line of the sub display region is set in parallel or vertically to the scan line of the main display region. The orthographic projections of the display data signal line of the sub display region and the scan line of the main display region will form an overlapping region on the substrate 101. Such a structure makes a parasitic capacitance be formed between the display data signal line of the sub display region and the scan line of the main display region. Moreover, the signal voltage variation amplitude on the display data signal line of the sub display region is large, generally between 1-10 V, which will interfere with the scan signal of the main display region which is overlapped with the display data signal line of the sub display region. A part of the scan signal lines of the main display region passes through the sub display region, and the display data signal of the sub display region is a signal that is continuously changed, which will interfere with the scan signal line of the first metal layer 103 overlapped with the display data signal of the sub display region, and degrade the display quality of the main display region. In particular, the brightness of the pixel unit P1 of the main display region located at two sides of the sub display region is smaller than the brightness of the pixel unit P2 of the normal main display region. The normal main display region refers to a main display region that is not driven by a scan signal of the sub display region.

Figure 3:
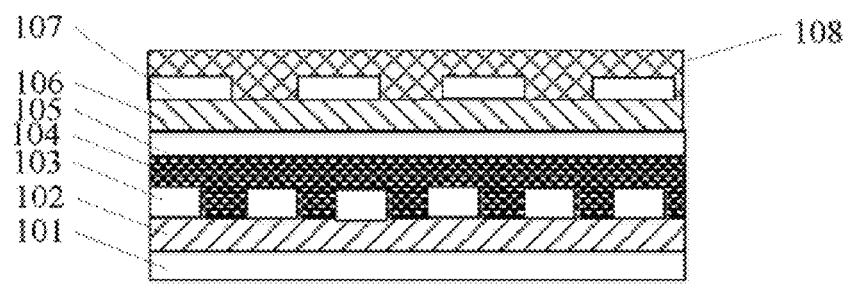
FIG. 3 illustrates an exemplary structural block diagram of a sub display region of a display panel according to an embodiment of the present application.

Referring to FIG. 3, a display panel includes a main display region 10 and a sub display region 20. The sub display region 20 is fully-surrounded or half-surrounded by the main display region 10.

The sub display region 20 includes a substrate 101, a first insulating layer 102, a first metal layer 103, a second insulating layer 104, a second metal layer 105, a dielectric layer 106, and a third metal layer 107 stacked successively. In the embodiment, a signal line of the first metal layer 103 is used to transmit a scan signal of the main display region 10, and a signal line of the third metal layer 107 is used to transmit a display data signal of the sub display region 20.

The second metal layer 105 is used as an isolation layer for isolating signal interference between the first metal layer and the third metal layer.

The main display region can adopt an AM (Active Matrix) driving manner, and the sub display region can adopt a PM (Passive Matrix) driving manner. The PM driving manner can constitute a matrix simply by a cathode and an anode, and light up the electroluminescent device in the array in a scan manner. An isolation layer is provided between the first metal layer 103 and the third metal layer 107, avoiding an adverse effect of the display data signal of the third metal layer on the scan signal of the first metal layer, so that each pixel unit of the main display region can be normally displayed, and problems of uneven display brightness caused by signal interference is avoided.

In some embodiments, an orthographic projection of the second metal layer on the substrate at least covers an orthographic projection of the first metal layer on the substrate. In order to eliminate signal interference caused by the display signal line of the third metal layer, the orthographic projection of the second metal layer serving as the isolation layer on the substrate at least covers an orthographic projection of the third metal layer on the substrate. The second metal layer can adopt a surface-shaped structure (i.e., its entirety is a planar film), or a mesh structure, or a strip structure. It will be appreciated that when a strip structure is adopted, an orthographic projection of an isolation bar on the substrate covers an orthographic projection of one corresponding signal line of the third metal layer.

In some embodiments, the second metal layer is connected to a power source signal of the display panel. The power source signal can be a positive electrode signal for driving a DC power source of the sub display region. Alternatively, the second metal layer is connected to other stable DC power signals. The second metal layer is connected to a stable voltage signal, and the isolation layer having a good shielding performance can be formed.

Figure 4:
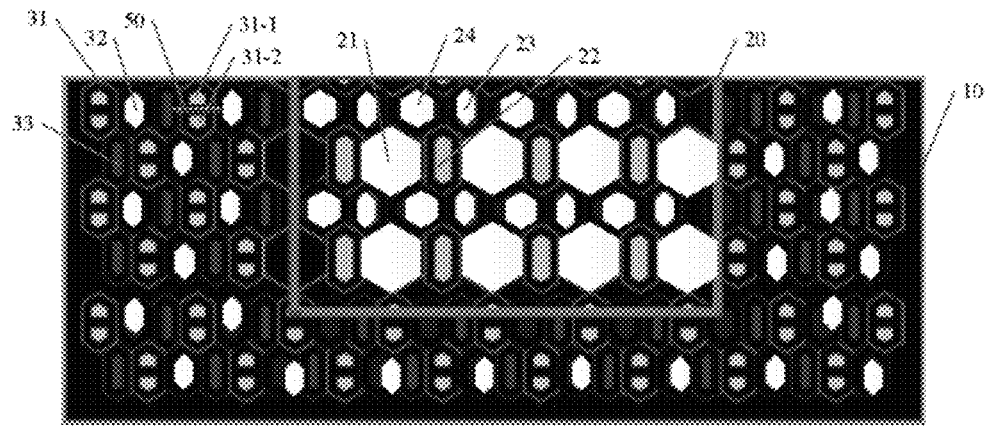
FIG. 4 shows an exemplary plan view of a display panel according to an embodiment of the present application.

Referring to FIG. 4, in some embodiments, the sub display region 20 includes uniformly distributed pixel units. Each pixel unit includes a first sub-pixel, and the first sub-pixel is a light-transmitting sub-pixel 21 that is capable of transmitting external light. The PM driving manner of the sub display region can constitute a matrix simply by a cathode and an anode, and light up the electroluminescent device in the array in a scan manner. Therefore, the hierarchical structure of the sub display region is simple, which is advantageous for setting the light-transmitting sub pixel.

As shown in FIG. 4, the sub display region 20 includes uniformly distributed pixel units. Each pixel unit includes a second sub-pixel 22, a third sub-pixel 23, and a fourth sub-pixel 24, each of which is provided with an electroluminescent device respectively, and the electroluminescent device is disposed in a functional layer (not shown in the figure) on the flat layer 108. It can be seen that the full screen display is implemented by setting a sub-pixel unit in the sub display region.

The main display region 10 includes uniformly distributed pixel units. Each pixel unit includes a first sub-pixel 31, a second sub-pixel 32, and a third sub-pixel 33, each of which is provided with an electroluminescent device respectively, and the electroluminescent device of the first sub-pixel 31 includes a first light-emitting region 31-1 and a second light emitting region 31-2 that are axis symmetrical. It can be seen that the structure of the pixel unit of the main display region and the sub display region is different. The pixel unit of the sub display region includes four sub-pixel units, one of which is a light-transmitting sub-pixel that is not provided with an electroluminescent device, and other pixel units are all provided with the electroluminescent device. The pixel unit of the main display region includes three sub-pixel units each provided with an electroluminescent device, wherein the electroluminescent device of one of the sub-pixels includes a first light-emitting region 31-1 and a second light emitting region 31-2 that are symmetrical. As shown in FIG. 4, the first light-emitting region and the second light emitting region employ a symmetrical structure, and the symmetry axis is a dashed line 50 in the figure.

In some embodiments, the the light-transmitting sub-pixel includes an opening region. The opening region penetrates the substrate 101, the first insulating layer 102, the first metal layer 103, the second insulating layer 104, the second metal layer 105, the dielectric layer 106, the third metal layer 107, the flat layer 108, and the functional layer, and the opening region is filled with a light-transmitting material. Through the arrangement of the light-transmitting sub-pixel, the photosensitive elements such as the camera disposed below the sub display region can collect and sense the external light.

Figure 5:
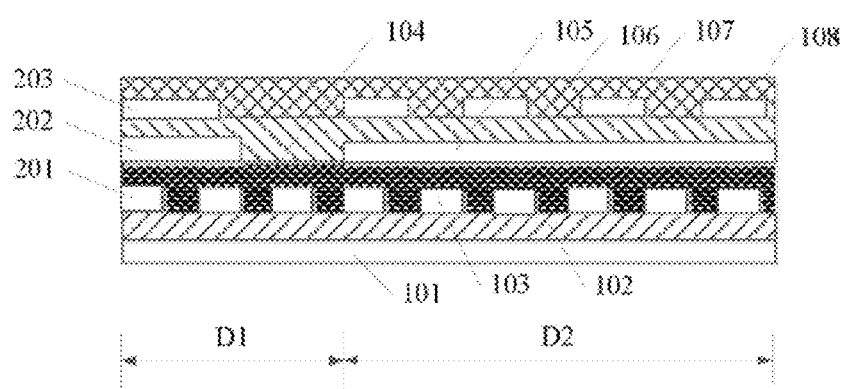
FIG. 5 shows an exemplary cross-sectional view of a display panel according to an embodiment of the present application.

As shown in FIG. 5, the main display region includes a substrate 101, a first insulating layer 102, a first gate electrode 201, a second insulating layer 104, a second gate electrode 202, a dielectric layer 106, a source-drain layer 203, and a flat layer 108 stacked successively.

In the embodiment, the first gate electrode and the first metal layer are disposed in an identical layer;
the second gate electrode and the second metal layer are disposed in an identical layer;
the source-drain layer and the third metal layer are disposed in an identical layer.

The setting of the second metal layer of the present application should try not to affect the structure and process of the main display region to the greatest extent. Therefore, some film layers of the sub display region are in the same layer as the film layers in the main display region. Although some film layers are set in the same layer, the patterns of the two regions are different, or the patterns of the two regions are the same but the functions are different. As shown in FIG. 5, the hierarchical structure of the sub display region fully takes advantage of the hierarchical structure of the main display region. The substrate 101, the first insulating layer 102, the second insulating layer 104, the dielectric layer 106, and the flat layer 108 are the film layers shared by the main display region and the sub display region. The first metal layer 103, the second metal layer 105, and the third metal layer of the sub display region are respectively provided in the same layer as the first gate electrode 201, the second gate electrode 202, and source-drain layer 203 of the main display region. The first gate electrode 201, the second gate electrode 202, and the source-drain layer of the main display region can be used as the gate electrode, the drain electrode of the thin film transistor, or as an electrode of the energy storage capacitor, which is not limited herein, and can be set as needed.

The present application also provides a display apparatus including the display panel provided in the embodiments of the present application.

In some embodiments, a side of the sub display region deviated from the first metal layer is provided with a photosensitive element, which senses external light through a light-transmitting sub-pixel of the sub display region. The photosensitive element includes a camera, an infrared sensor, an earphone, and other elements. It will be appreciated that when the handset is provided, the opening region of the light-transmitting sub-pixel of the sub display region may not fill any material, which is advantageous for providing a transmission channel of the voice.

Figure 6:
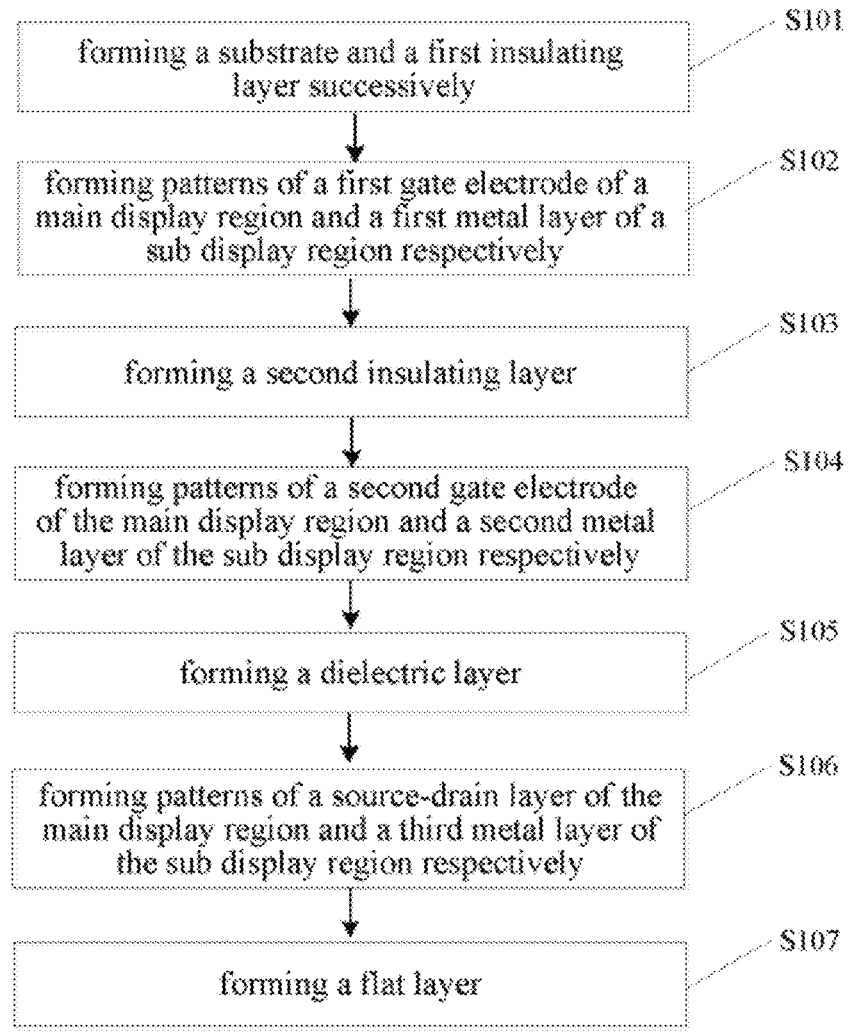
FIG. 6 shows an exemplary flow diagram of a method of manufacturing a display panel according to an embodiment of the present application.

Referring to FIG. 6, the present application also provides a method of manufacturing a display panel, including following steps:
step S101: forming a substrate and a first insulating layer successively;

step S102: forming patterns of a first gate electrode of a main display region and a first metal layer of a sub display region respectively;

step S103: forming a second insulating layer;

step S104: forming patterns of a second gate electrode of the main display region and a second metal layer of the sub display region respectively;

step S105: forming a dielectric layer;

step S106: forming patterns of a source-drain layer of the main display region and a third metal layer of the sub display region respectively; and step S107: forming a flat layer.

The description will be made below in connection with FIGS. 7 to 12.

Figure 7:
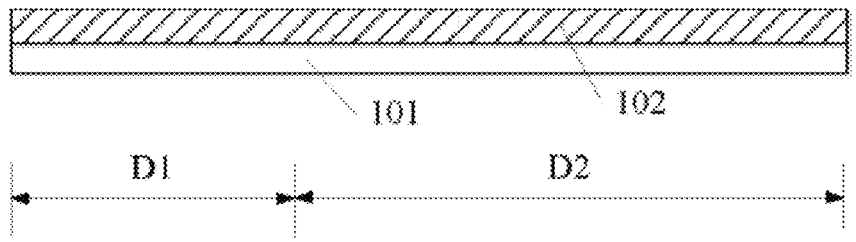
FIGS. 7 to 12 show specific exemplary schematic diagrams of the method of manufacturing the display panel according to FIG. 6.

In step S101, as shown in FIG. 7, the substrate 101 and the first insulating layer 102 are formed in the main display region and the sub display region. The substrate 101 can be a flexible substrate, and the material can be a polyimide.

Figure 8:
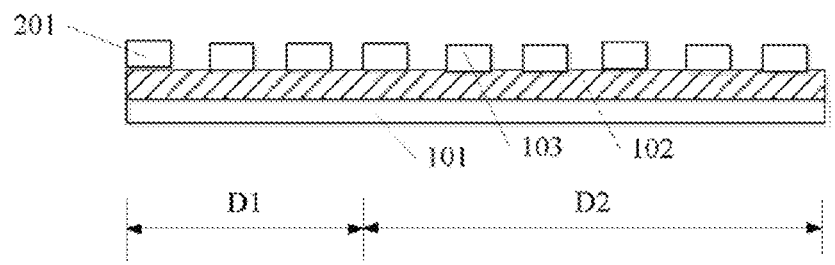

In step S102, as shown in FIG. 8, patterns of the first gate electrode 201 and the first metal layer 103 are formed in the main display region and the sub display region. It can be understood that the patterns of the scan line in the first gate electrode 201 and the first metal layer 103 may be the same or different, which is determined according to the functionality to be implemented, and is not limited herein.

Figure 9:
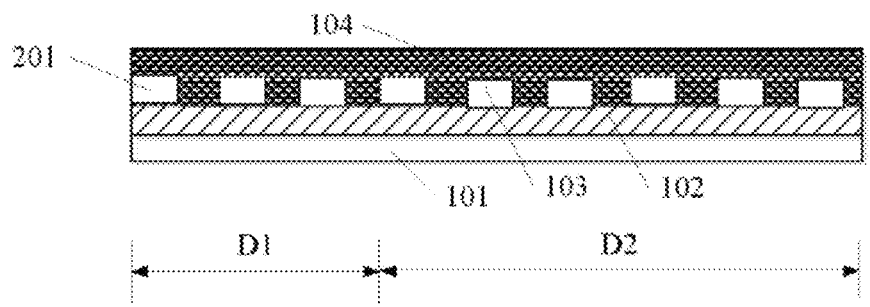

In step S103, as shown in FIG. 9, an insulating layer 104 covering the first gate electrode 201 and the first metal layer 103 is formed in the main display region and the sub display region. The insulating layer 104 is disposed between the first metal layer 103 and the second metal layer 105 to play a role of insulation.

Figure 10:
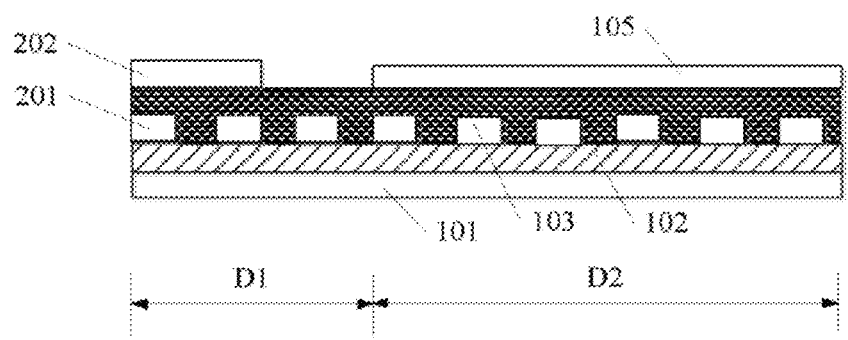

In step S104, as shown in FIG. 10, the pattern of the second gate electrode 202 and the pattern of the second metal layer 105 are formed in the main display region and the sub display region respectively. The second metal layer 105 serves as an isolation layer for isolating signal interference on the first metal layer 103 by the third metal layer 107. The pattern of the second metal layer 105 may be a planar film or a mesh shape or a comb shape. The pattern of the second gate electrode 202 is not limited.

Figure 11:
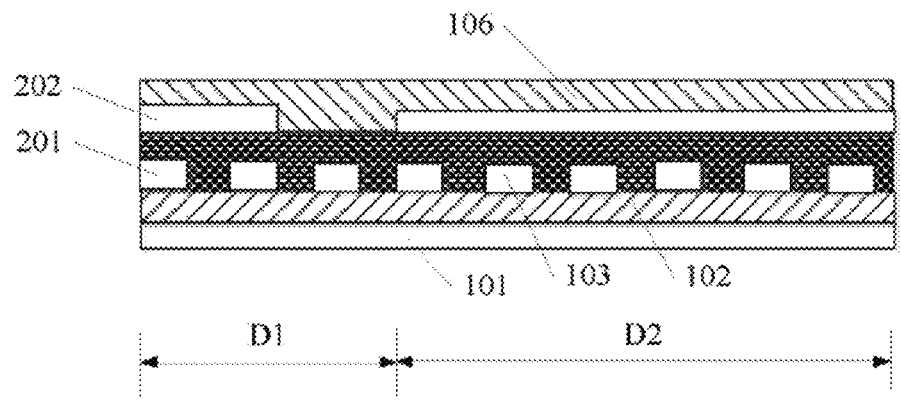

In step S105, as shown in FIG. 11, a dielectric layer 106 covering the main display region and the sub display region is formed.

Figure 12:
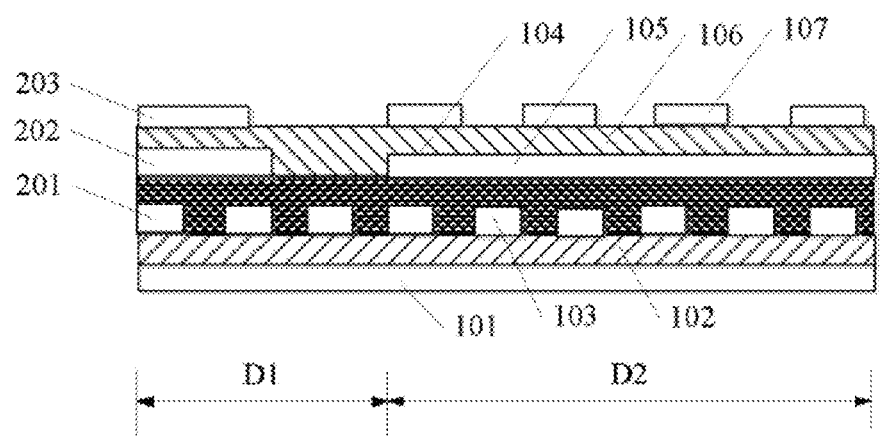

In step S106, as shown in FIG. 12, patterns of the source-drain electrode 203 and the third metal layer 107 are formed in the main display region and the sub display region respectively. It should be noted that, in the main display region, the film layer can be used to form the pattern of the source-drain electrode of the thin film transistor or form the electrode pattern of the energy storage capacitor according to different regions, which is not limited herein.

In step S108, as shown in FIG. 5, a flat layer 108 is formed on the source-drain electrode 203 and the third metal layer 107. In the subsequent process, an electroluminescent device of the main display region and the sub display region may be formed respectively on the flat layer 108.

The above description is only one or more embodiments of the present application and an explanation of the applied technical principles. Those skilled in the art should understand that the scope of the disclosure involved in this application is not limited to the technical solution formed by the specific combination of the above technical features, and should also cover other technical solutions formed by any combination of the above technical features and their equivalent features without departing from the inventive concept, for example, the technical solution formed by interchanging the above-mentioned features and the technical features having similar functions disclosed in this application (but not limited to).

What is claimed is:

1. A display panel, comprising:
a main display region and a sub display region, wherein:
the sub display region is surrounded by the main display region; the main display region adopts an active matrix driving manner, and the sub display region adopts a passive matrix driving manner;
the sub display region comprises a substrate, a first insulating layer, a first metal layer, a second insulating layer, a second metal layer, a dielectric layer, a third metal layer, and a flat layer stacked successively in order;
a signal line of the first metal layer is used to transmit a scan signal of the main display region, and a signal line of the third metal layer is used to transmit a display data signal of the sub display region; and
the second metal layer is used for isolating signal interference between the first metal layer and the third metal layer;
wherein an orthographic projection of the second metal layer on the substrate at least covers an orthographic projection of the signal line of the third metal layer on the substrate.

2. The display panel according to claim 1, wherein the second metal layer is a surface-shaped film and connected to a power source signal of the display panel.

3. The display panel according to claim 1, wherein a pixel unit of the sub display region comprises a first sub-pixel, and the first sub-pixel is a light-transmitting sub-pixel that is able to transmit external light.

4. The display panel according to claim 3, wherein the pixel unit of the sub display region further comprises a second sub-pixel, a third sub-pixel and a fourth sub-pixel, each of which is provided with an electroluminescent device respectively, and the electroluminescent device is disposed in a functional layer on the flat layer.

5. The display panel according to claim 4, wherein:
a pixel unit of the main display region comprises a first sub-pixel, a second sub-pixel, and a third sub-pixel, each of which is provided with an electroluminescent device respectively; and
the electroluminescent device of the first sub-pixel comprises a first light-emitting region and a second light emitting region that are symmetrical.

6. The display panel according to claim 3, wherein:
the light-transmitting sub-pixel comprises an opening region, the opening region penetrates the substrate, the first insulating layer, the first metal layer, the second insulating layer, the second metal layer, the dielectric layer, the third metal layer, the flat layer and the functional layer; and
the opening region is provided with a light-transmitting material.

7. The display panel according to claim 1, wherein:
the main display region comprises a substrate, a first insulating layer, a first gate electrode, a second insulating layer, a second gate electrode, a dielectric layer, a source-drain layer, and a flat layer stacked successively;
the first gate electrode and the first metal layer are disposed in an identical layer;
the second gate electrode and the second metal layer are disposed in an identical layer; and the source-drain layer and the third metal layer are disposed in an identical layer.

8. A display apparatus, comprising:
a display panel, comprising a main display region and a sub display region, the sub display region being surrounded by the main display region, wherein:
the main display region adopts an active matrix driving manner, and the sub display region adopts a passive matrix driving manner;
the sub display region comprises a substrate, a first insulating layer, a first metal layer, a second insulating layer, a second metal layer, a dielectric layer, a third metal layer, and a flat layer stacked successively in order;
a signal line of the first metal layer is used to transmit a scan signal of the main display region, and a signal line of the third metal layer is used to transmit a display data signal of the sub display region;
the second metal layer is used for isolating signal interference between the first metal layer and the third metal layer;
wherein an orthographic projection of the second metal layer on the substrate at least covers an orthographic projection of the signal line of the third metal layer on the substrate.

9. The display apparatus according to claim 8, wherein a side of the sub display region deviated from the first metal layer is provided with a photosensitive element, which senses external light through a light-transmitting sub-pixel of the sub display region.

10. The display apparatus according to claim 8, wherein the second metal layer is a surface-shaped film and connected to a power source signal of the display panel.

11. The display apparatus according to claim 8, wherein a pixel unit of the sub display region comprises a first sub-pixel, and the first sub-pixel is a light-transmitting sub-pixel that is able to transmit external light.

12. The display apparatus according to claim 11, wherein the pixel unit of the sub display region further comprises a second sub-pixel, a third sub-pixel and a fourth sub-pixel, each of which is provided with an electroluminescent device respectively, and the electroluminescent device is disposed in a functional layer on the flat layer.

13. The display apparatus according to claim 12, wherein a pixel unit of the main display region comprises a first sub-pixel, a second sub-pixel, and a third sub-pixel, each of which is provided with an electroluminescent device respectively, and the electroluminescent device of the first sub-pixel comprises a first light-emitting region and a second light emitting region that are symmetrical.

14. The display apparatus according to claim 11, wherein the light-transmitting sub-pixel comprises an opening region, the opening region penetrates the substrate, the first insulating layer, the first metal layer, the second insulating layer, the second metal layer, the dielectric layer, the third metal layer, the flat layer and the functional layer, and the opening region is provided with a light-transmitting material.

15. The display apparatus according to claim 8, wherein:
the main display region comprises a substrate, a first insulating layer, a first gate electrode, a second insulating layer, a second gate electrode, a dielectric layer, a source-drain layer, and a flat layer stacked successively;
the first gate electrode and the first metal layer are disposed in an identical layer;
the second gate electrode and the second metal layer are disposed in an identical layer; and
the source-drain layer and the third metal layer are disposed in an identical layer.

* * * * *